(12) United States Patent  (10) Patent No.: US 8,445,924 B2
Jeong et al.  (45) Date of Patent: May 21, 2013

(54) LIGHT EMITTING DEVICE

(75) Inventors: Hwanhee Jeong, Seoul (KR);
Junghyeok Bae, Seoul (KR); Hyunju Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/363,568

(22) Filed: Feb. 1, 2012

(65) Prior Publication Data

US 2012/0193654 A1  Aug. 2, 2012

(30) Foreign Application Priority Data

Feb. 1, 2011  (KR) .................. 10-2011-0010008

(51) Int. Cl.
*H01L 29/18* (2006.01)

(52) U.S. Cl.
USPC .......... 257/88; 257/96; 257/97; 257/E33.062; 257/E33.064

(58) Field of Classification Search
USPC .................. 257/88, 96, 97, E33.062, E33.064
See application file for complete search history.

(56) References Cited

U.S. PATENT DOCUMENTS

2011/0198635 A1* 8/2011 Kim et al. .................. 257/98

* cited by examiner

*Primary Examiner* — Tan N Tran
(74) *Attorney, Agent, or Firm* — Birch, Stewart, Kolasch & Birch, LLP (57) ABSTRACT

A light emitting device is disclosed. The light emitting device includes a support member, a light emitting structure disposed over the support member and includes first and second light emitting structures, the first and second light emitting structures including a first semiconductor layer, a second semiconductor layer, and an active layer, a passivation layer disposed on one side surface of the first light emitting structure, a first electrode disposed between the support member and the first semiconductor layer in the first light emitting structure, a second electrode disposed on a side surface of the passivation layer and on the second semiconductor layer in the first light emitting structure, a third electrode disposed between the support member and the first semiconductor layer in the second light emitting structure, an insulation layer disposed with a through hole, and a fourth electrode disposed in the through hole.

14 Claims, 8 Drawing Sheets

LIGHT EMITTING DEVICE

CROSS-REFERENCE TO RELATED APPLICATION

This application claims the priority benefit of Korean Patent Application No. 10-2011-0010008, filed on Feb. 1, 2011 in the Korean Intellectual Property Office, the disclosure of which is incorporated herein by reference.

BACKGROUND

1. Field

Embodiments relate to a light emitting device.

2. Description of the Related Art

Light Emitting Diodes (LEDs) are representative of light emitting devices, and refer to devices which convert electric signals into light such as infrared light or visible light using characteristics of compound semiconductors. Such LEDs are being utilized in home appliances, remote controllers, electronic displays, displays and various other automated machines, and the application range thereof is gradually increasing.

In General, miniature LEDs are fabricated into surface mount devices so as to be directly mounted on a Printed Circuit Board (PCB), and hence, LED lamps, which serve as display devices, are being developed into surface mount devices. The surface mount devices can substitute for conventional simple lamps and are used in a variety of color on-and-off displays and character displays and image displays.

As the application range of LEDs is broad, lamps used in life, distress signal lamps, or the like require high luminance. Therefore, luminance of the LEDs needs to be increased.

In addition, resistance to Electrostatic Discharge (ESD) must reach a predetermined level or more in order to apply the light emitting devices to a lighting apparatus, etc. However, if the resistance to ESD is lowered, reliability of the light emitting devices may be deteriorated due to the ESD generated, for example, when the light emitting devices come into contact with human bodies or are inserted into a substrate or the like. Consequently, a power supply unit for supplying power to the light emitting devices and various electronic devices may be damaged.

BRIEF DESCRIPTION OF THE DRAWINGS

Details of embodiments will be more clearly understood from the following detailed description taken in conjunction with the accompanying drawings, in which.

DETAILED DESCRIPTION OF EMBODIMENTS

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

Figure 1:
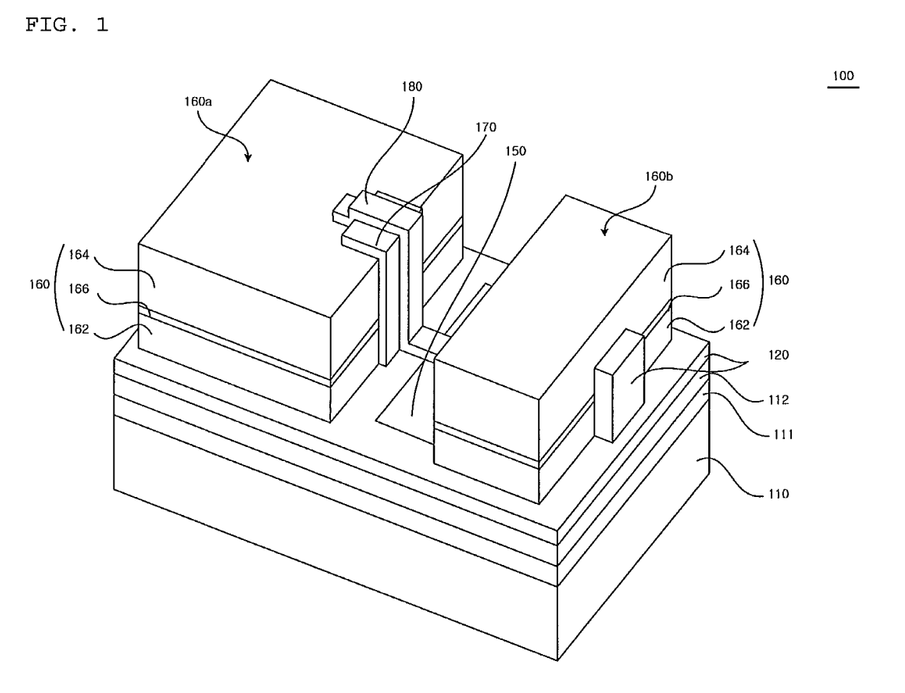
FIG. 1 is a perspective view illustrating a light emitting device according to an exemplary embodiment.
Figure 2:
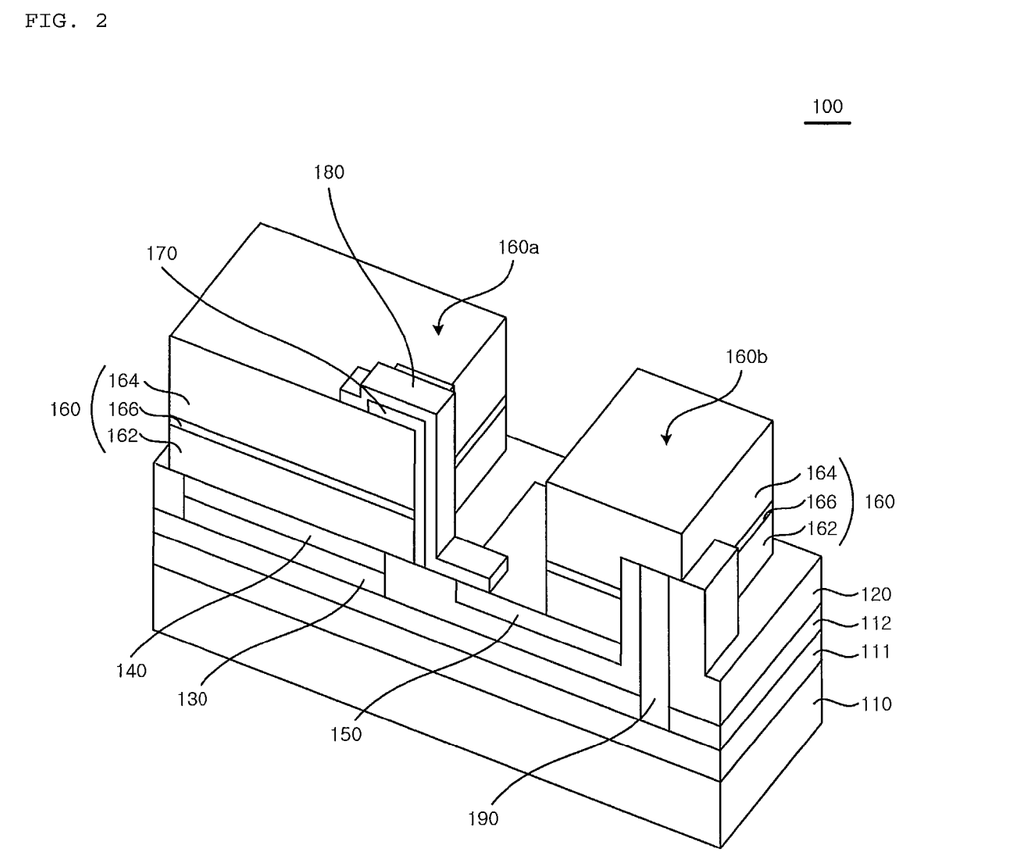
FIG. 2 is a sectional view illustrating a cutting plane of the light emitting device shown in FIG. 1.

FIG. 1 is a perspective view illustrating a light emitting device according to an exemplary embodiment. FIG. 2 is a sectional view illustrating a cutting plane of the light emitting device shown in FIG. 1.

Referring to FIGS. 1 and 2, the light emitting device, which is designated by reference numeral 100, may include a support member 110 and a light emitting structure 160 above the support member 110.

The support member 110 may be made of a material having superior thermal conductivity, or alternatively made of a conductive material. For example, the support member 110 may be made of a metal or conductive material. The support member 110 may have a single layer structure. Alternatively, the support member 110 may have a double layer structure or a multilayer structure having three or more layers.

Although the support member 110 in the illustrated embodiment has been described as having conductivity, the present disclosure is not limited thereto. For example, the support member 110 may be non-conductive.

The support member 110 is made of at least one of gold (Au), nickel (Ni), tungsten (W), molybdenum (Mo), copper (Cu), aluminum (Al), tantalum (Ta), silver (Ag), platinum (Pt), chromium (Cr), or (and) copper-tungsten (Cu—W). Also, the support member 110 may be formed by laminating two or more layers of different materials. Furthermore, the support member 110 may be formed using a carrier wafer (for example, Si, Ge, GaAs, ZnO, SiC, SiGe, GaN, $Ga_2O_3$, or the like).

The support member 110 functions to easily dissipate heat generated from the light emitting device 100, and thus to achieve an enhancement in thermal stability.

A bonding layer 111 may be laminated on the support member 110. The bonding layer 111 functions to minimize an electromigration phenomenon in which atoms in a first electrode 140 migrate due to an electric field during application of current. Also, the bonding layer 111 may be made of a metal material having superior bonding force to the material of an under layer. An anti-diffusion layer 112 may be further formed over the bonding layer 111.

The metal material, which is used as the bonding layer 111 and has superior bonding force, may contain at least one of indium (In), tin (Sn), silver (Ag), niobium (Nb), nickel (Ni), aluminum (Au), or (and) copper (Cu). The anti-diffusion layer 112 may be made of at least one of platinum (Pt), palladium (Pd), tungsten (W), nickel (Ni), ruthenium (Ru), molybdenum (Mo), iridium (Ir), rhodium (Rh), tantalum (Ta), hafnium (Hf), zirconium (Zr), niobium (Nb), or (and) vanadium (V). Thus, each of the bonding layer 111 and the anti-diffusion layer 112 may have a single layer structure or a multilayer structure.

Although the bonding layer 111 and the anti-diffusion layer 112 in the illustrated embodiment have been described as being formed separately from each other, the present disclosure is not limited thereto. That is, the bonding layer 111 and the anti-diffusion layer 112 may be formed as one layer, and a laminating order thereof is not limited thereto.

A light emitting structure 160 may be formed over the anti-diffusion layer 112, and the light emitting structure 160 may include a first light emitting structure 160a of a luminous region and a second light emitting structure 160b of a Zener region. Also, each of the first light emitting structure 160a and the second light emitting structure 160b may include a first semiconductor layer 162, a second semiconductor layer 164, and an active layer 166 interposed between the first and second semiconductor layers 162 and 164.

In this case, the first and second light emitting structures 160a and 160b may be spaced apart from each other, but the present disclosure is not limited thereto.

Here, the light emitting structure 160 will be described as the configuration including the first semiconductor layer 162, the second semiconductor layer 164, and the active layer 166 interposed between the first and second semiconductor layers 162 and 164.

The first semiconductor layer 162 may be implemented as a p-type semiconductor layer. The p-type semiconductor layer may be any one of GaN-based compound semiconductor layers such as a GaN layer, an AlGaN layer, an InGaN layer, and the like, and be doped with a p-type dopant.

In other words, the first semiconductor layer 162 may be made of a semiconductor material having a formula of $In_xAl_yGa_{(1-x-y)}N$ ($0 \leq x \leq 1, 0 \leq y \leq 1$, and $0 \leq x+y \leq 1$). For example, the first semiconductor layer 162 may be made of a semiconductor material selected from GaN, AlN, AlGaN, InGaN, InN, InAlGaN, AlInN, and the like, and may be doped with a p-type dopant such as Mg, Zn, Ca, Sr, Ba, or the like.

The active layer 166 may be formed on the first semiconductor layer 162. The active layer 166 refers to a region where holes injected from the first semiconductor layer 162 and electrons injected from the second semiconductor layer 166 described below are recombined. In accordance with recombination of electrons and holes, the active layer 166 transitions to a lower energy level, so that it may generate light having a wavelength corresponding to the energy level.

The active layer 166 may be made of, for example, a semiconductor material having a formula of $In_xAl_yGa_{1-y-x}N$ ($0 \leq x \leq 1, 0 \leq y \leq 1$, and $0 \leq x+y \leq 1$). The active layer 166 may have a single quantum well structure or a multi quantum well (MQW) structure.

In addition, the active layer 166 may also have a quantum wire structure, and a quantum dot structure.

The second semiconductor layer 164 may be formed on the active layer 166. The second semiconductor layer 164 may be implemented as an n-type semiconductor layer. The n-type semiconductor layer may be any one of GaN-based compound semiconductor layers such as a GaN layer, an AlGaN layer, an InGaN layer, and the like, and be doped with an n-type dopant.

The second semiconductor layer 164 may be made of, for example, a semiconductor material having a formula of $In_xAl_yGa_{1-y-x}N$ ($0 \leq x \leq 1, 0 \leq y \leq 1$, and $0 \leq x+y \leq 1$). For example, the second semiconductor layer 164 may be made of a semiconductor material selected from InAlGaN, GaN, AlGaN, InGaN, AlN, InN, and the like, and may be doped with an n-type dopant such as Si, Ge, Sn, or the like.

Meanwhile, the above-mentioned first semiconductor layer 162, active layer 166, and second semiconductor layer 164 may be formed using metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or sputtering, but the present disclosure is not limited thereto.

A reflective film 130 and a first electrode 140 may be formed between the support member 110 and the first semiconductor layer 162 of the first light emitting structure 160a.

When a portion of light generated from the active layer 166 of the first light emitting structure 160a is directed toward the support member 110, the reflective film 130 reflects the light such that the reflected light is directed in an upward direction of the light emitting device 100. Thus, it may be possible to enhance light extraction efficiency of the light emitting device 100.

Accordingly, the reflective film 130 may be made of a material having high light reflectance, such as silver (Ag), aluminum (Al), platinum (Pt), palladium (Pd), copper (Cu), or the like, but the present disclosure is not limited thereto. For example, the reflective film 130 may be made of any other material in addition to the above-mentioned materials.

The first electrode 140 may contain at least one of nickel (Ni), platinum (Pt), ruthenium (Ru), iridium (Ir), rhodium (Rh), tantalum (Ta), molybdenum (Mo), titanium (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO), or (and) indium zinc oxide (IZO).

Meanwhile, the reflective film 130 may be formed to have the same width as the first electrode 140. The reflective film 130 and the first electrode 140 may be formed through simultaneous sintering thereof, so that superior bonding force may be obtained.

Although the reflective film 130 and the first electrode 140 have been described as having the same widths and lengths as shown in FIGS. 1 and 2, they may have at least one of different widths and lengths. Of course, the present disclosure is not limited to the above-mentioned conditions.

Here, a third electrode 150, which is spaced apart from the first electrode 140, may be formed between the support member 110 and the first semiconductor layer 162 of the second light emitting structure 160b.

The third electrode 150 may be made of the same material as the first electrode 140, and may supply electrons to the first semiconductor layer 162 in the same manner as the first electrode 140.

An insulation layer 120 may be formed in at least one of outer peripheral side surfaces of the reflective film 130 and first electrode 140 and between the third electrode 150 and the anti-diffusion layer 112.

The insulation layer 120 may contain at least one of metal and insulation materials. When the insulation layer 120 contains a metal material, the metal material may exhibit lower electrical conductivity than the materials of the first and third electrodes 140 and 150 in order to prevent power applied to the first and third electrodes 140 and 150 from being applied to the light emitting structure 160.

The insulation layer 120 may contain at least one of titanium (Ti), nickel (Ni), platinum (Pt), lead (Pb), rhodium (Rh), iridium (Ir), or (and) tungsten (W), or at least one of aluminum oxide ($Al_2O_3$), silicon oxide ($SiO_2$), silicon nitride ($Si_3N_4$), or (and) titanium oxide (TiOx), or at least one of indium tin oxide (ITO), aluminum zinc oxide (AZO), or (and) indium zinc oxide (IZO).

A passivation layer 170 may be formed at one side surface of the first light emitting structure 160a, which is between the first and second light emitting structures 160a and 160b. A second electrode 180 may be formed at a side surface of the passivation layer 170 and on the second semiconductor layer 164 of the first light emitting structure 160a.

The second electrode 180 may be made of nickel (Ni) or the like. A convex/concave pattern may be formed at a portion of or throughout an upper surface of the second semiconductor layer 164 where the second electrode 180 is formed, by a certain etching method, in order to achieve an enhancement in light extraction efficiency, but the present disclosure is not limited thereto.

The second semiconductor layer 164 in the illustrated embodiment will be described as not being formed, at the upper surface thereof, with the convex/concave pattern.

The insulation layer 120 may be formed from the first semiconductor layer 162 of the second light emitting structure 160b to an inner side of the second semiconductor layer 164 thereof.

Also, the insulation layer 120 may be formed from the first semiconductor layer 162 of the second light emitting structure 160b of the Zener region to the inner side of the second semiconductor layer 164 thereof, and be formed with a through hole (not shown). In this case, the anti-diffusion layer 112 may be formed with a hole corresponding to a position of the through hole.

In this regard, the through hole may be formed with a fourth electrode 190 for electrically connecting the second semiconductor layer 164 of the second light emitting structure 160b to the bonding layer 111.

Here, the fourth electrode 190 comes into contact with Ga-face GaN exhibiting relatively superior crystallinity and thermal stability to N-face GaN in the second semiconductor layer 164 of the second light emitting structure 160b, and Electrostatic Discharge (ESD), which is electrically connected between the first and second semiconductor layers 162 and 164, passes through the Zener region, thereby enabling protection of the luminous region. As a result, reliability of the light emitting device 100 may be enhanced.

In this case, the N-face and Ga-face of the second semiconductor layer 164 may have a different exposed portion depending on growth and etching directions thereof.

FIGS. 3 to 8 are sectional views illustrating sequential processes of a method for manufacturing the light emitting device according to the illustrated embodiment.

Figure 3:
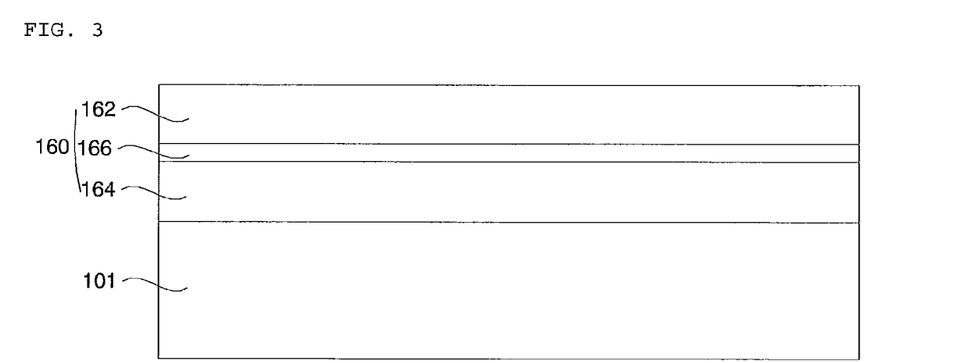
FIGS. 3 to 8 are sectional views illustrating sequential processes of a method for manufacturing the light emitting device according to the illustrated embodiment.

Referring to FIG. 3, in the light emitting device 100, the light emitting structure 160 may be grown on a growth substrate 101.

The growth substrate 101 may be made of a material selected from the group consisting of sapphire ($Al_2O_3$), GaN, SiC, ZnO, Si, GaP, InP, GaAs, and the like. Although not shown, a buffer layer (not shown) may be formed between the growth substrate 101 and the light emitting structure 160.

The buffer layer may be made of a combination of Group III and Group V elements, or be made of at least one of GaN, InN, AlN, InGaN, AlGaN, InAlGaN, or (and) AlInN. The buffer layer may also be doped with a dopant.

An undoped semiconductor layer (not shown) may be formed over the growth substrate 101 or the buffer layer (not shown). Any one or both of the buffer layer (not shown) and undoped semiconductor layer (not shown) may be formed or omitted. The present disclosure is not limited to such structures.

The light emitting structure 160, which includes the first semiconductor layer 162, the active layer 166, and the second semiconductor layer 164, may be disposed on the growth substrate 101. Since the first semiconductor layer 162, the active layer 166, and the second semiconductor layer 164 are similar to those described with reference to FIGS. 1 and 2, no detailed description thereof will be given.

Figure 4:
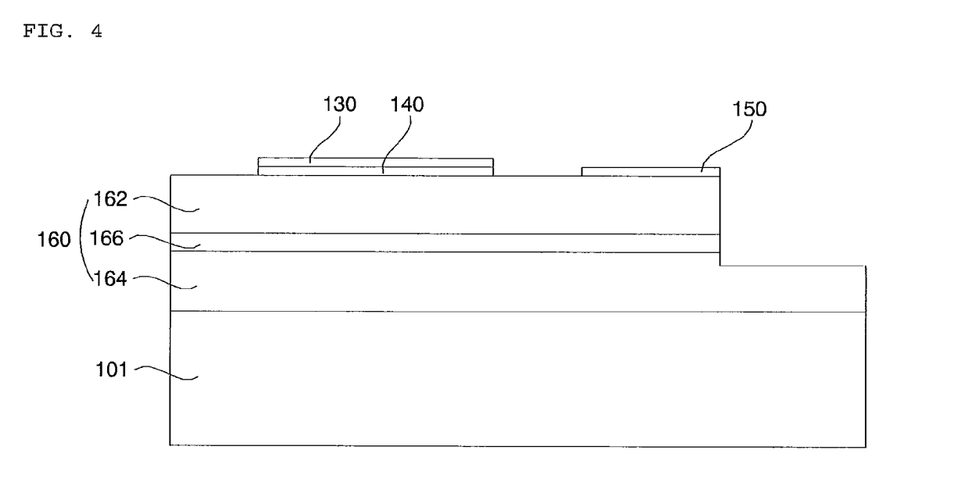

Referring to FIG. 4, the light emitting structure 160 grown on the growth substrate 101 may be partially etched.

That is, after the light emitting structure 160 is etched from the first semiconductor layer 162 to a portion of the inner side of the second semiconductor layer 164, the first and third electrodes 140 and 150 may be formed.

Here, when the second semiconductor layer 164 is made of GaN, N-face GaN having a high concentration of N may be formed adjacent to the growth substrate 101 and Ga-face GaN having a relatively higher concentration of Ga than that of N may be formed adjacent to the active layer 166, depending on the growth direction thereof.

That is, the Ga-face GaN is formed to be spaced apart from the growth substrate 101 having different lattice constants as compared with the N-face GaN, thereby having superior crystallinity and thermal stability.

Also, the reflective film 130 may be formed on the first electrode 140. Since the reflective film 130 is similar to that described with reference to FIG. 1, no detailed description thereof will be given.

In this case, the reflective film 130 has been described as not being formed on the third electrode 150, but the present disclosure is not limited thereto. For example, the reflective film 130 may also be formed on the third electrode 150.

Here, the reflective film 130 may be formed in a flat shape at a back surface thereof which does not come into contact with the first electrode 140, but the present disclosure is not limited thereto. For example, the back surface of the reflective film 130 may be formed with a convex/concave shape (not shown).

If the back surface of the reflective film 130 is formed with the convex/concave shape, light extraction efficiency generated in the light emitting structure 160 may be considerably increased.

Mesa etching is carried out upon outer regions of the reflective film 130 and first electrode 140. The mesa etching may be implemented using a dry etching method. The reflective film 130 and the first electrode 140 may be simultaneously etched, or be separately etched, but the present disclosure is not limited thereto.

Figure 5:
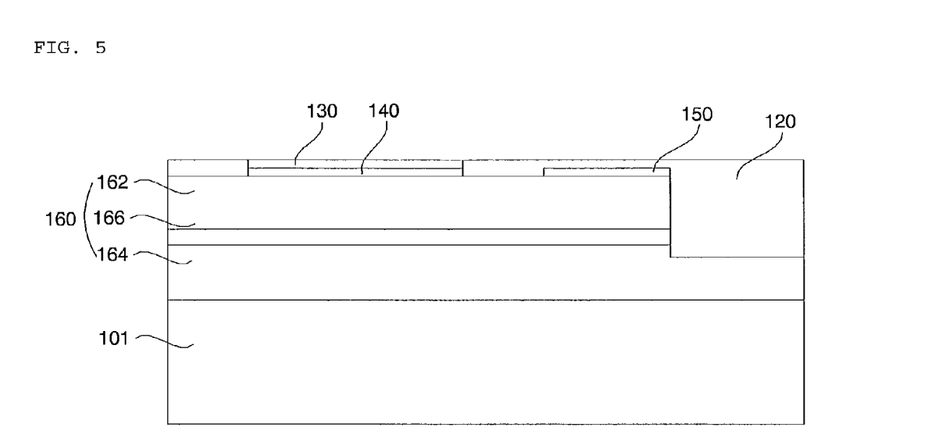

Referring to FIG. 5, the insulation layer 120 may be formed at the outer peripheral side surfaces of the reflective film 130 and first electrode 140 and on the third electrode 150.

Here, the insulation layer 120 may function to prevent exposure of the first semiconductor layer 162 of the light emitting structure 160 to the outside, thereby preventing water penetration from the outside. Thus, it may be possible to prevent corrosion of the light emitting structure 160.

Figure 6:
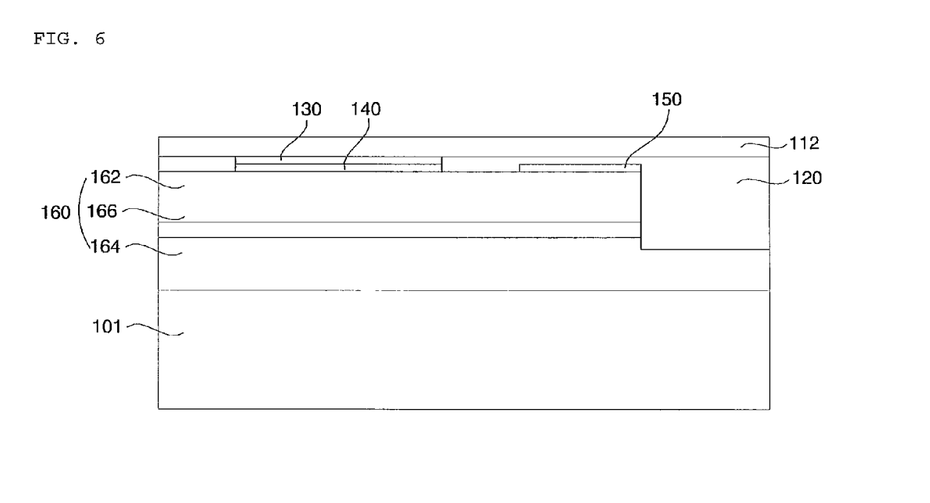

Referring to FIG. 6, the anti-diffusion layer 112 may be formed on the insulation layer 120.

The anti-diffusion layer 112 may function to prevent power supplied to the first and third electrodes 140 and 150 from being diffused, thereby allowing current to be concentrated on the first semiconductor layer 162.

Figure 7:
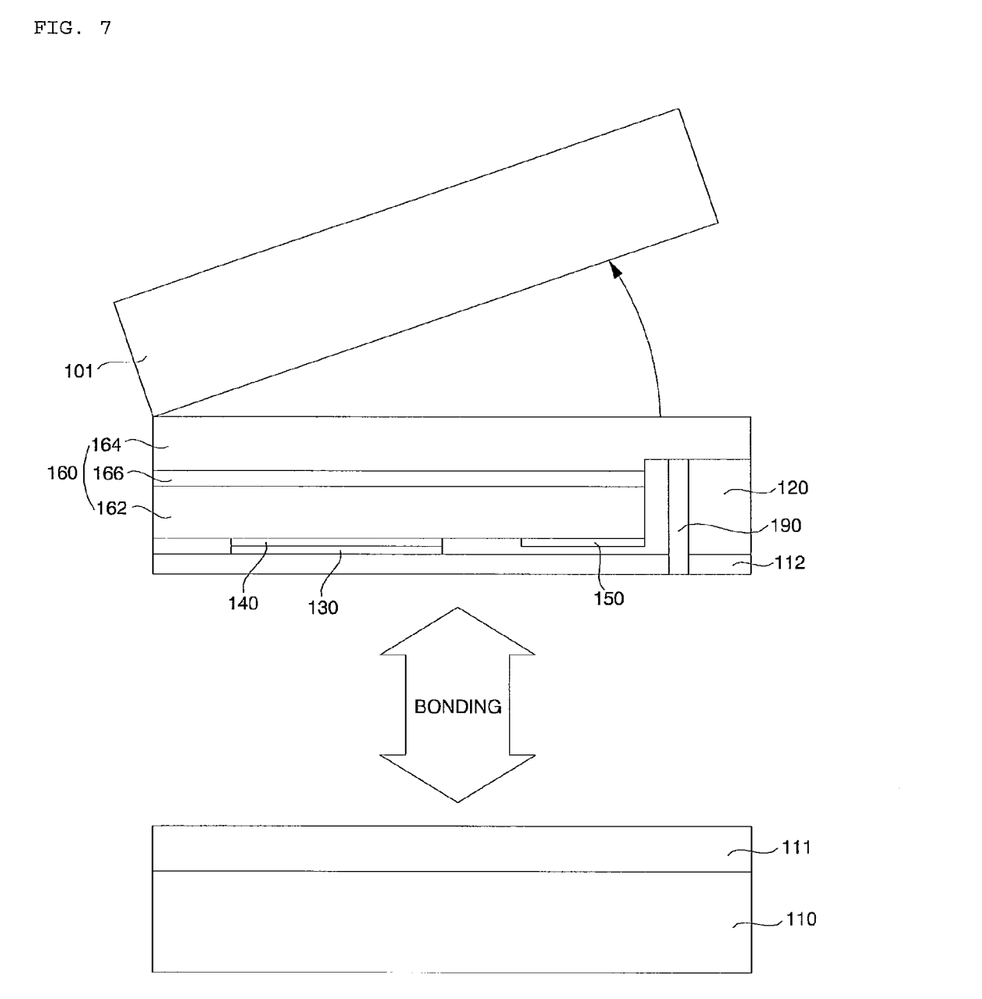

Referring to FIG. 7, the through hole (not shown) is formed up to the inner side of the second semiconductor layer 164 at the anti-diffusion layer 112 and the insulation layer 120, and then formed with the fourth electrode 190.

In this case, the fourth electrode 190 may come into contact with the Ga-face GaN of the second semiconductor layer 164, which is exposed as shown in FIG. 4.

Subsequently, the support member 110 having a conductive material may be bonded over the anti-diffusion layer 112.

The support member 110 may be bonded to the anti-diffusion layer 112 by the bonding layer 111.

Once the support member 110 is formed, it is disposed as a base. Thereafter, the above-mentioned growth substrate 101 is removed. Here, the growth substrate 101 may be removed using a physical and/or chemical method. As to the physical method, for example, a laser lift-off (LLO) method may be used.

Meanwhile, although not shown, the buffer layer (not shown) disposed on the light emitting structure 160 may be removed after removal of the growth substrate 101. In this case, the buffer layer may be removed through a dry or wet etching method or a polishing process.

Figure 8:
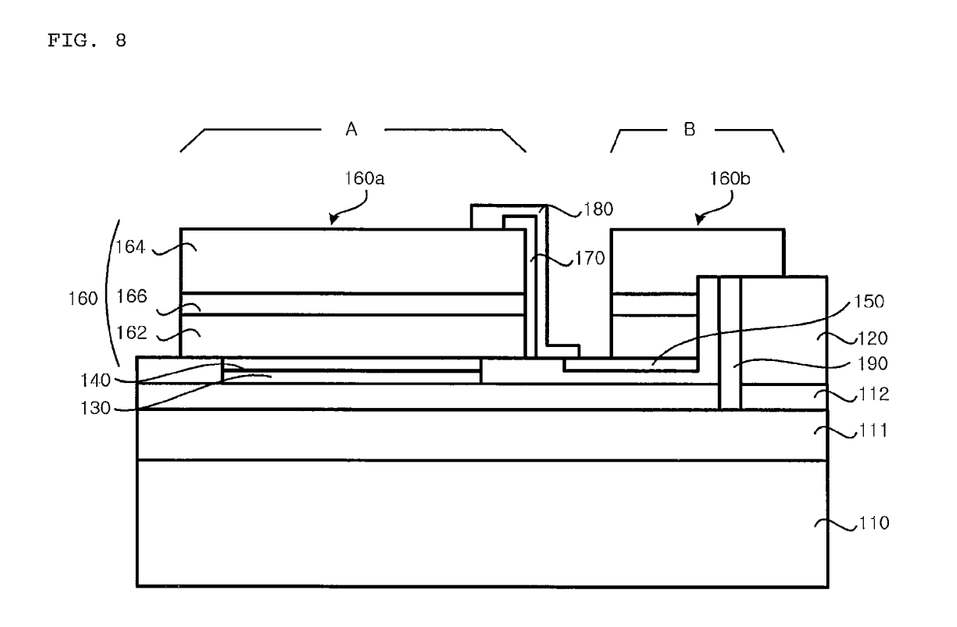

Referring to FIG. 8, an etching process may be carried out upon the light emitting structure 160 bonded to the support member 110 so that the light emitting structure 160 is divided into the first light emitting structure 160a of the luminous region A and the second light emitting structure 160b of the Zener region B.

In this case, the first and second light emitting structures 160a and 160b are divided and spaced apart from each other. The passivation layer 170 may be formed at the side surface of the first light emitting structure 160a, which is between the first and second light emitting structure 160a and 160b.

Although the passivation layer 170 in the illustrated embodiment has been described as being formed up to the upper portion of the second semiconductor layer 164 of the first light emitting structure 160a, the present disclosure is not limited thereto. For example, the passivation layer 170 may not be formed at the upper portion of the second semiconductor layer 164.

Subsequently, the second electrode 180 may be formed on the passivation layer 170.

The second electrode 180 may be disposed on the second semiconductor layer 164 of the first light emitting structure 160a, and come into contact with the third electrode 150 formed beneath the first semiconductor layer 162 of the second light emitting structure 160b.

The convex/concave pattern (not shown) may be formed at a portion of or throughout the upper surface of the second semiconductor layer 164 of the first light emitting structure 160a, but the present disclosure is not limited thereto.

In this case, an insulation member (not shown) may be formed at an exposed upper surface of the third electrode 150, but the present disclosure is not limited thereto.

Meanwhile, although the illustrated embodiment describes a vertical type light emitting device, the present disclosure is not limited thereto. For example, the present disclosure may also be applied to a horizontal type light emitting device.

Also, at least one process of the processes shown in FIGS. 3 to 8 may be implemented in a reversed order, but the present disclosure is not limited thereto.

Figure 9:
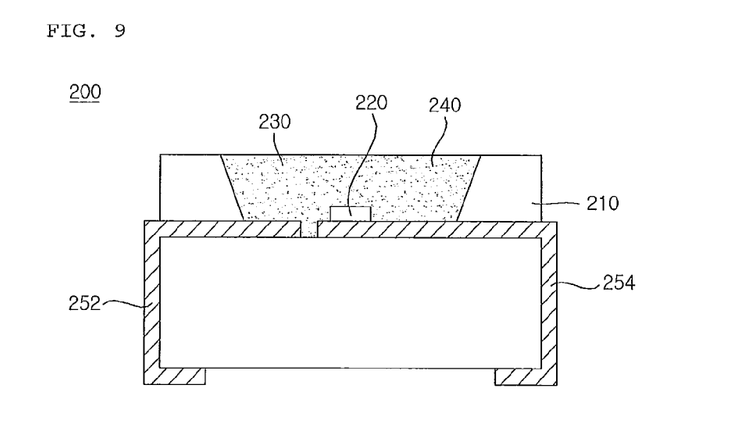
FIG. 9 is a sectional view illustrating a light emitting device package including a light emitting device according to an exemplary embodiment.

FIG. 9 is a sectional view illustrating a light emitting device package including a light emitting device according to an exemplary embodiment.

Referring to FIG. 9, the light emitting device package, which is designated by reference numeral 200, may include a body 210 formed with a cavity, a light emitting device 220 mounted on a bottom surface of the body 210, and a resin material 230 filled in the cavity. The resin material 230 may contain a phosphor 240.

The body 210 may be made of at least one of a resin material such as polyphthalamide (PPA), silicon (Si), aluminum (Al), aluminum nitride (AlN), liquid crystal polymer such as photo sensitive glass (PSG), polyamide 9T (PA9T), syndiotactic polystyrene (SPS), a metal material, sapphire ($Al_2O_3$), beryllium oxide (BeO), or (and) ceramic, or may be a Printed Circuit Board (PCB). The body 210 may be formed by an injection molding process, an etching process or the like, but the disclosure is not limited thereto.

The body 210 may have an inclined surface at an inner surface thereof. In accordance with the inclination of the inclined surface, a reflective angle of light emitted from the light emitting device 220 may be varied. Thus, an orientation angle of outwardly emitted light may be adjusted.

When viewed from the top, the cavity formed at the body 210 may have a circular, square, polygonal or elliptical shape. In particular, the cavity may have curved corners. Of course, the cavity is not limited to the above-mentioned shapes.

The light emitting device 220 is mounted on the bottom surface of the body 210. In one example, the light emitting device 220 may be the light emitting device shown in FIG. 1 and described with reference to FIG. 1. The light emitting device 220 may be, for example, a colored light emitting device to emit red, green, blue or white light, or an ultraviolet (UV) light emitting device to emit ultraviolet light, but the present disclosure is not limited thereto. In addition, one or more light emitting devices may be mounted.

Meanwhile, the body 210 may include a first lead frame 252 and a second lead frame 254. The first and second lead frames 252 and 254 may be electrically connected to the light emitting device 220 so as to supply power to the light emitting device 220.

The first and second lead frames 252 and 254 are electrically isolated from each other. The first and second lead frames 252 and 254 may function to reflect light generated by the light emitting device 220, thereby enhancing luminous efficiency. The first and second lead frames 252 and 254 may also outwardly dissipate heat generated from the light emitting device 220.

The first and second lead frames 252 and 254 may contain at least one of metal materials, for example, titanium (Ti), copper (Cu), nickel (Ni), gold (Au), chromium (Cr), tantalum (Ta), platinum (Pt), tin (Sn), silver (Ag), phosphor (P), aluminum (Al), indium (In), palladium (Pd), cobalt (Co), silicon (Si), germanium (Ge), hafnium (Hf), ruthenium (Ru), or (and) iron (Fe), or an alloy thereof. The first and second lead frames 252 and 254 may also be formed to have a single layer structure or a multilayer structure, but the present disclosure is not limited thereto.

The resin material 230 may fill the cavity, and may contain the phosphor 240. The resin material 230 may be made of transparent silicon, epoxy resin, or other resin material. The resin material 230 may be formed by filling the cavity with an encapsulating material, and curing the filled material using ultraviolet light or heat.

The kind of the phosphor 240 may be selected depending on a wavelength of light emitted from the light emitting device 220 so that the light emitting device package 200 may realize emission of white light.

The phosphor 240 contained in the resin material 230 may be any one of a blue, bluish green, green, yellowish green, yellow, yellowish red, orange, and red luminous phosphors depending on the wavelength of light emitted from the light emitting device 220.

That is, the phosphor 240 may be excited by light emitted from the light emitting device 220 at a first wavelength, so as to generate light of a second wavelength. For example, when the light emitting device 220 is a blue light emitting diode and the phosphor 240 is a yellow phosphor, the yellow phosphor is excited by blue light, thereby emitting yellow light. In this case, the light emitting device package 220 may provide white light as the blue light generated from the blue light emitting diode and the yellow light generated in accordance with the excitation by the blue light are mixed.

Similarly, when the light emitting device 220 is a green light emitting diode, a magenta phosphor or a mixture of blue and red phosphors may be used as the phosphor 240. Also, when the light emitting device 220 is a red light emitting diode, a cyan phosphor or a mixture of blue and green phosphors may be used as the phosphor 240.

The phosphor 240 may be a known phosphor such as a YAG-based, TAG-based, sulfide-based, silicate-based, aluminate-based, nitride-based, carbide-based, nitridosilicate-based, borate-based, fluoride-based, or phosphate-based phosphor.

Figure 10:
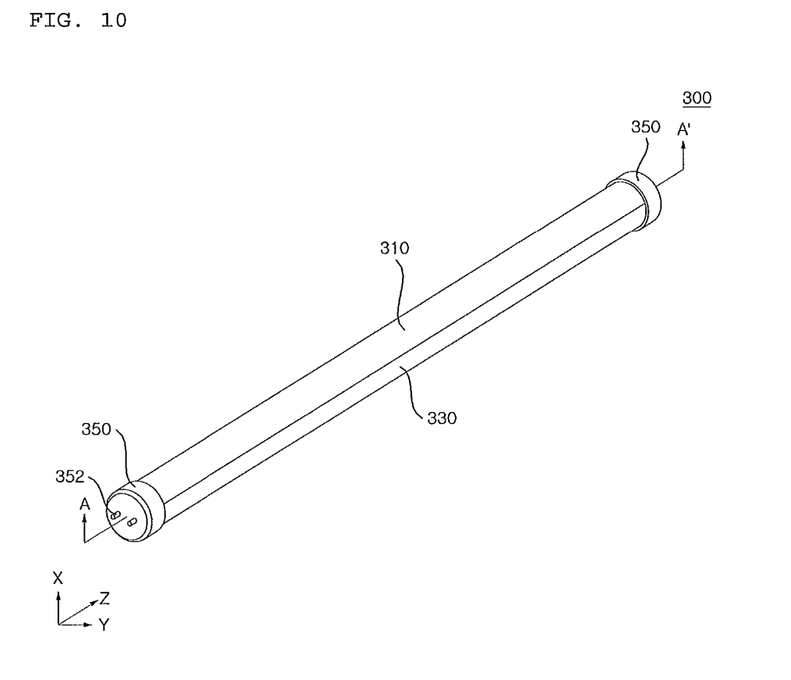
FIG. 10 is a perspective view illustrating a lighting apparatus including a light emitting device according to an exemplary embodiment.
Figure 11:
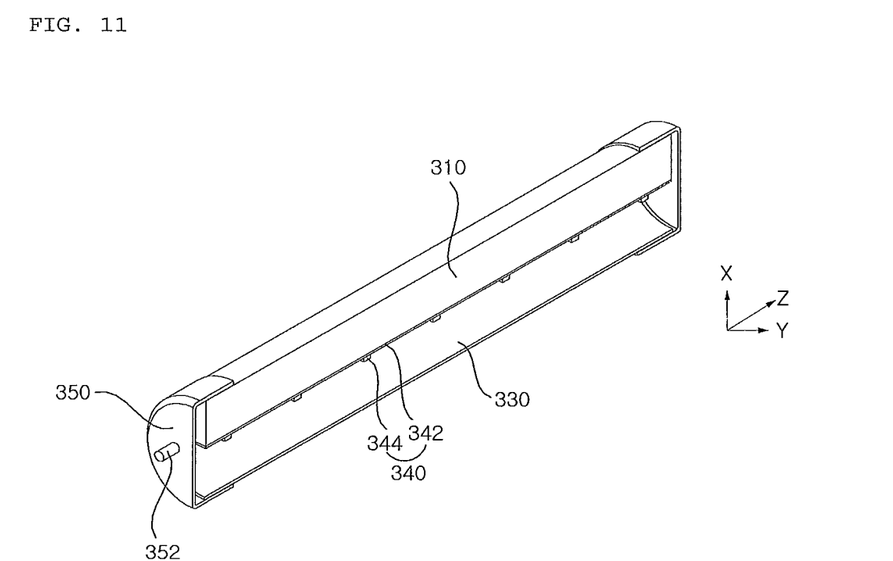
FIG. 11 is a sectional view taken along line A-A' of the lighting apparatus shown in FIG. 10.

FIG. 10 is a perspective view illustrating a lighting apparatus including a light emitting device according to an exemplary embodiment. FIG. 11 is a sectional view taken along line A-A' of the lighting apparatus shown in FIG. 10.

In the following description, for explaining the shape of the lighting apparatus, which is designated by reference numeral 300, according to the illustrated embodiment in more detail, a longitudinal direction of the lighting apparatus 300 is referred to as a "longitudinal direction Z", a horizontal direction perpendicular to the longitudinal direction Z is referred to as a "horizontal direction Y", and a height direction perpendicular to both the longitudinal direction Z and the horizontal direction Y is referred to as a "height direction X".

That is, FIG. 11 is a sectional view taken along a Z-X plane of the lighting apparatus 300 shown in FIG. 10, and viewed in the horizontal direction Y.

Referring to FIGS. 10 and 11, the lighting apparatus 300 may include a body 310, a cover 330 coupled to the body 310, and end caps 350 located at opposite ends of the body 310.

A light emitting device module 340 is coupled to a lower surface of the body 310. The body 310 may be made of a metal material having superior conductivity and superior heat radiation effects so as to outwardly dissipate heat generated from the light emitting device module 340 through an upper surface of the body 310.

The light emitting device module 340 includes a PCB 342 and light emitting device packages 344, each of the light emitting device packages 344 including a light emitting device (not shown). The light emitting device packages 344 may be mounted on the PCB 342 in multiple rows while having various colors, to form a multi-color array. The light emitting device packages 344 may be mounted at the same distance, or may be mounted at different distances to enable brightness adjustment, if necessary. The PCB 342 may be a metal core PCB (MCPCB), a flame retardant-4 (FR4) PCB, or the like.

The cover 330 may have a circular shape to enclose the lower surface of the body 310, but the present disclosure is not limited thereto.

The cover 330 serves to protect the light emitting device module 340 from external foreign matter, etc. The cover 330 may contain light diffusion particles to achieve anti-glare effects and uniform emission of light generated from the light emitting device packages 344. At least one of inner and outer surfaces of the cover 330 may be provided with a prism pattern. Also, a phosphor may be applied to at least one of the inner and outer surfaces of the cover 330.

Since the light generated from the light emitting device packages 344 is outwardly emitted through the cover 330, the cover 330 should have high light transmittance and heat resistance sufficient to endure heat generated from the light emitting device packages 344. To this end, the cover 330 may be made of polyethylene terephthalate (PET), polycarbonate (PC), polymethyl methacrylate (PMMA), or the like.

The end caps 350 may be disposed at the opposite ends of the body 310, and function to seal a power supply unit (not shown). Each end cap 350 is formed with power pins 352, so that the lighting apparatus 300 according to the illustrated embodiment may be directly connected to a terminal, from which an existing fluorescent lamp has been removed, without an additional connector.

Figure 12:
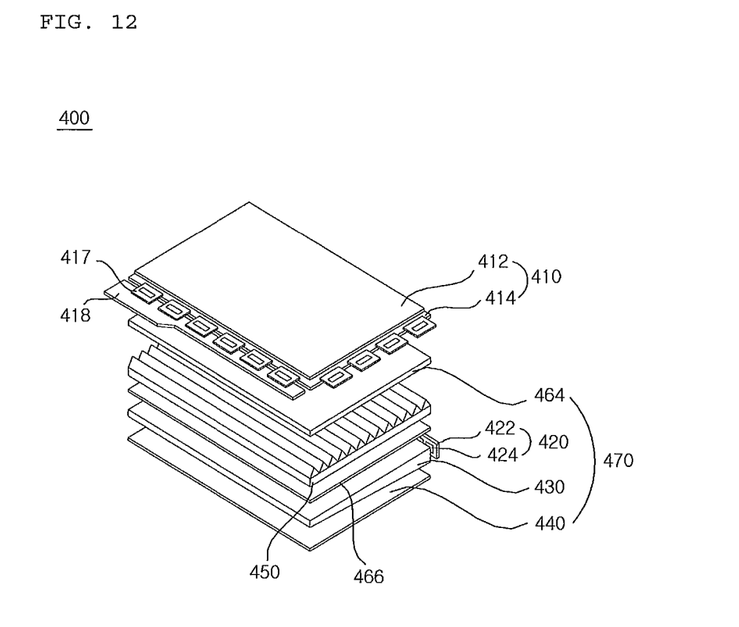
FIG. 12 is an exploded perspective view illustrating a liquid crystal display apparatus including a light emitting device according to a first embodiment.

FIG. 12 is an exploded perspective view illustrating a liquid crystal display apparatus including a light emitting device according to a first embodiment.

FIG. 12 illustrates an edge-light type liquid crystal display apparatus. The liquid crystal display apparatus, which is designated by reference numeral 400, may include a liquid crystal display panel 410 and a backlight unit 470 for supply of light to the liquid crystal display panel 410.

The liquid crystal display panel 410 may display an image using the light supplied from the backlight unit 470. The liquid crystal display panel 410 may include a color filter substrate 412 and a thin film transistor substrate 414, which face each other with liquid crystals interposed therebetween.

The color filter substrate 412 may realize the color of an image displayed through the liquid crystal display panel 410.

The thin film transistor substrate 414 is electrically connected to a printed circuit board (PCB) 418, on which a plurality of circuit elements is mounted, by means of a drive film 417. The thin film transistor substrate 414 may apply drive voltage provided by the PCB 418 to liquid crystals in response to a drive signal transmitted from the PCB 418.

The thin film transistor substrate 414 may include pixel electrodes and thin film transistors in the form of thin films formed on another substrate made of a transparent material such as glass or plastic.

The backlight unit 470 includes a light emitting device module 420 to emit light, a light guide plate 430 to change light emitted from the light emitting device module 420 into planar light and to provide the planar light to the liquid crystal display panel 410, a plurality of films 450, 466 and 464 to enhance uniformity in luminance distribution and vertical light incidence of light emerging from the light guide plate 430, and a reflective sheet 440 to reflect light emitted rearwards from the light guide plate 430 toward the light guide plate 430.

The light emitting device module 420 may include a plurality of light emitting device packages 424 and a PCB 422 on which the plural light emitting device packages 424 are mounted to form an array.

Meanwhile, since the light emitting device included in each light emitting device package 424 is similar to that described with reference to FIG. 1, no description thereof will be given.

The backlight unit 470 may include a diffusion film 466 to diffuse light incident thereupon from the light guide plate 430 toward the liquid crystal display panel 410, and a prism film 450 to concentrate the diffused light so as to enhance vertical light incidence. The backlight unit 470 may further include a protective film 464 to protect the prism film 450.

Figure 13:
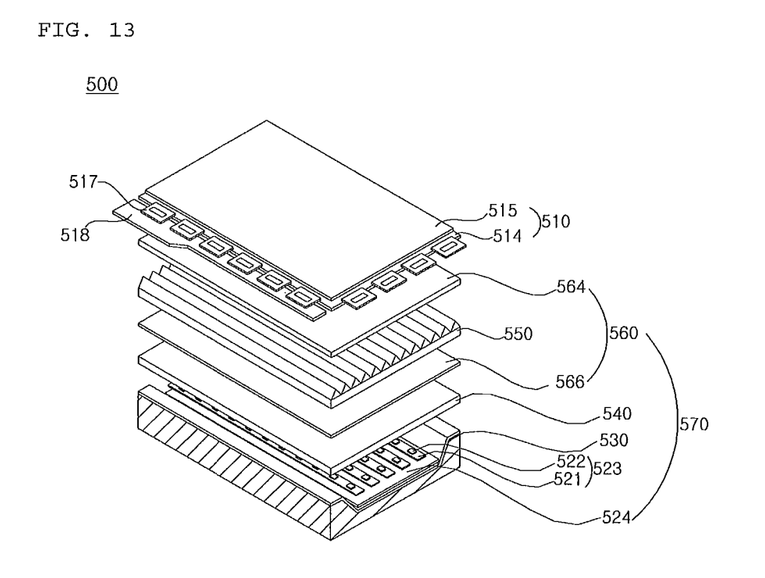
FIG. 13 is an exploded perspective view illustrating a liquid crystal display apparatus including a light emitting device according to a second embodiment.

FIG. 13 is an exploded perspective view illustrating a liquid crystal display apparatus including a light emitting device according to a second embodiment.

The same configuration as that illustrated in FIG. 12 and described with reference to FIG. 12 will not be repeatedly described in detail.

FIG. 13 illustrates a direct type liquid crystal display apparatus. The liquid crystal display apparatus, which is designated by reference numeral 500, may include a liquid crystal display panel 510 and a backlight unit 570 for supply of light to the liquid crystal display panel 510.

Since the liquid crystal display panel 510 is similar to that of FIG. 12, no detailed description thereof will be given.

The backlight unit 570 may include a plurality of light emitting device modules 523, a reflective sheet 524, a lower chassis 530 in which the light emitting device modules 523 and reflective sheet 524 are accommodated, a diffusion sheet 540, and a plurality of optical films 560, the diffusion sheet 540 and the optical films 560 being disposed over the light emitting device modules 523.

Each light emitting device module 523 may include a plurality of light emitting device packages 522, and a PCB 521 on which the plural light emitting device packages 522 are mounted to form an array.

The reflective sheet 524 reflects light generated by the light emitting device packages 522 toward the liquid crystal display panel 510, thereby achieving an enhancement in light utilization efficiency.

Meanwhile, the light generated from the light emitting device modules 523 is incident upon the diffusion sheet 540. The optical films 560 are disposed over the diffusion sheet 540. The optical films 560 may be comprised of a diffusion film 566, a prism film 550 and a protective film 564.

Here, the lighting apparatus 300, and the liquid crystal display apparatuses 400 and 500 may be included in a lighting system. In addition, an apparatus or the like, which includes a light emitting device package and is used for illumination, may be included in the lighting system.

The disclosure may provide a light emitting device package, which includes the light emitting device in the illustrated embodiment and a light emitting device having a new structure, and a lighting system including the same.

The light emitting device in the illustrated embodiment may enhance thermal stability by connecting the electrode, which comes into contact with N-face of the n-type semiconductor layer included in the first light emitting structure of the luminous region, to the electrode, which comes into contact with the p-type semiconductor layer included in the second light emitting structure of the Zener region. Thus, it may be possible to enhance ESD characteristics and reliability.

Particular features, structures, or characteristics described in connection with the embodiment are included in at least one embodiment of the present disclosure and not necessarily in all embodiments. Furthermore, the particular features, structures, or characteristics of any specific embodiment of the present disclosure may be combined in any suitable manner with one or more other embodiments or may be changed by those skilled in the art to which the embodiments pertain. Therefore, it is to be understood that contents associated with such combination or change fall within the spirit and scope of the present disclosure.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device comprising:
a support member;
a light emitting structure disposed on the support member, the light emitting structure comprises first and second light emitting structures spaced from each other, the first and second light emitting structures comprising a first semiconductor layer, a second semiconductor layer, and an active layer between the first and second semiconductor layers;
a passivation layer disposed on one side surface of the first light emitting structure adjacent to the second light emitting structure;
a first electrode disposed between the support member and the first semiconductor layer of the first light emitting structure and electrically connected to the support member;

a second electrode disposed on a side surface of the passivation layer and on the second semiconductor layer of the first light emitting structure;

a third electrode is disposed between the support member and the first semiconductor layer of the second light emitting structure and electrically connected to the second electrode;

an insulation layer disposed between the first and second light emitting structures and the support member while being disposed from the first semiconductor layer of the second light emitting structure to an inner side of the second semiconductor layer thereof, the insulation layer being disposed with a through hole from the first semiconductor layer to the inner side of the second semiconductor layer; and a fourth electrode disposed in the through hole and electrically connected to the second semiconductor layer of the second light emitting structure and the support member.

2. The light emitting device according to claim 1, further comprising a bonding layer between the support member and the light emitting structure.

3. The light emitting device according to claim 2, wherein the bonding layer comprises at least one of indium (In), tin (Sn), silver (Ag), niobium (Nb), nickel (Ni), aluminum (Au), or (and) copper (Cu).

4. The light emitting device according to claim 1, further comprising an anti-diffusion layer between the support member and the light emitting structure.

5. The light emitting device according to claim 4, wherein the anti-diffusion layer comprises at least one of platinum (Pt), palladium (Pd), tungsten (W), nickel (Ni), ruthenium (Ru), molybdenum (Mo), iridium (Ir), rhodium (Rh), tantalum (Ta), hafnium (Hf), zirconium (Zr), niobium (Nb), or (and) vanadium (V).

6. The light emitting device according to claim 4, wherein the anti-diffusion layer is disposed with a hole at a position corresponding to the through hole.

7. The light emitting device according to claim 1, wherein the second electrode contacts with N-face of the second semiconductor layer.

8. The light emitting device according to claim 1, wherein the fourth electrode comes into contact with Ga-face of the first semiconductor layer.

9. The light emitting device according to claim 1, wherein at least one of the first to fourth electrodes comprises at least one of nickel (Ni), platinum (Pt), ruthenium (Ru), iridium (Ir), rhodium (Rh), tantalum (Ta), molybdenum (Mo), titanium (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO), or (and) indium zinc oxide (IZO).

10. The light emitting device according to claim 1, further comprising a reflective film is disposed between the support member and the first electrode and electrically connected to the first electrode.

11. The light emitting device according to claim 10, wherein the reflective film has a convex/concave shape at a surface adjacent to the support member.

12. A light emitting device package comprising:
a light emitting device; and
a body comprises a first lead frame and a second lead frame spaced from the first lead frame, and the light emitting device disposed on the first lead frame, a cavity being disposed on the first and second lead frames, wherein:
the light emitting device comprises,
a support member electrically connected to the first lead frame;
a light emitting structure disposed over the support member and comprises first and second light emitting structures spaced from each other, the first and second light emitting structures comprising a first semiconductor layer, a second semiconductor layer, and an active layer between the first and second semiconductor layers;
a passivation layer disposed on one side surface of the first light emitting structure adjacent to the second light emitting structure;
a first electrode is disposed between the support member and the first semiconductor layer in the first light emitting structure and electrically connected to the support member;
a second electrode disposed on a side surface of the passivation layer and on the second semiconductor layer of the first light emitting structure, the second electrode electrically connected to the second lead frame;
a third electrode is disposed between the support member and the first semiconductor layer in the second light emitting structure and electrically connected to the second electrode;
an insulation layer disposed between the first and second light emitting structures and the support member while being disposed from the first semiconductor layer of the second light emitting structure to an inner side of the second semiconductor layer thereof, the insulation layer being disposed with a through hole from the first semiconductor layer to the inner side of the second semiconductor layer; and
a fourth electrode is disposed in the through hole and electrically connected to the second semiconductor layer of the second light emitting structure and the support member.

13. The light emitting device package according to claim 12, further comprising a resin material filled in the cavity, wherein the resin material comprises at least one of a phosphor, a light diffusion material, or (and) a light dispersion material.

14. A light emitting device array comprising:
a light emitting device package comprises a light emitting device; and
a substrate on which the light emitting device package is disposed, wherein:
the light emitting device comprises,
a support member;
a light emitting structure disposed over the support member and comprises first and second light emitting structures spaced from each other, the first and second light emitting structures comprising a first semiconductor layer, a second semiconductor layer, and an active layer between the first and second semiconductor layers;
a passivation layer disposed on one side surface of the first light emitting structure adjacent to the second light emitting structure;
a first electrode is disposed between the support member and the first semiconductor layer in the first light emitting structure and electrically connected to the support member;
a second electrode disposed on a side surface of the passivation layer and on the second semiconductor layer in the first light emitting structure;
a third electrode is disposed between the support member and the first semiconductor layer of the second light emitting structure and electrically connected to the second electrode;
an insulation layer disposed between the first and second light emitting structures and the support member while being disposed from the first semiconductor layer of the second light emitting structure to an inner side of the second semiconductor layer thereof, the insulation layer being disposed with a through hole from the first semiconductor layer to the inner side of the second semiconductor layer; and a fourth electrode is disposed in the through hole and electrically connected to the second semiconductor layer of the second light emitting structure and the support member.

* * * * *